United States Patent [19]

Page, Jr. et al.

[11] Patent Number: 5,821,743

[45] Date of Patent: Oct. 13, 1998

[54] MAGNETOSTRICTIVE WAVEGUIDE POSITION MEASUREMENT APPARATUS WITH PIEZOCERAMIC ELEMENT

[75] Inventors: William J. Page, Jr., Raleigh, N.C.; Richard D. Koski, Troy, Mich.

[73] Assignee: Patriot Sensors & Control Corporation, Clawson, Mich.

[21] Appl. No.: 776,000

[22] Filed: Jan. 3, 1997

[51] Int. Cl.[6] .............................. G01B 7/14; G01F 23/30; H03H 9/22

[52] U.S. Cl. ............................... 324/207.13; 324/207.12; 73/290 V; 333/148

[58] Field of Search ..................... 324/207.13, 207.17, 324/207.22, 207.24, 533, 207.12; 73/314, 313, 319, 290 V, DIG. 2, DIG. 5; 367/180; 333/148

[56] References Cited

U.S. PATENT DOCUMENTS

| | | | |
|---|---|---|---|
| 3,703,681 | 11/1972 | Johnson et al. | 324/249 |
| 4,839,590 | 6/1989 | Koski et al. | 324/207.13 |
| 4,943,773 | 7/1990 | Koski et al. | 324/207.13 |
| 5,017,867 | 5/1991 | Dumais et al. | 324/207.13 |
| 5,050,430 | 9/1991 | Begin et al. | 324/207.13 |
| 5,196,791 | 3/1993 | Dumais | 324/207.13 |
| 5,212,444 | 5/1993 | Abramovich et al. | 324/207.13 |
| 5,258,707 | 11/1993 | Begin et al. | 324/207.13 |
| 5,274,328 | 12/1993 | Begin et al. | 324/207.12 |
| 5,313,160 | 5/1994 | Gloden et al. | 324/207.13 |
| 5,406,200 | 4/1995 | Begin et al. | 324/207.13 |
| 5,412,316 | 5/1995 | Dumais et al. | 324/207.13 |
| 5,473,245 | 12/1995 | Silvus, Jr. et al. | 324/207.13 |
| 5,545,984 | 8/1996 | Gloden et al. | 324/207.13 |
| 5,590,091 | 12/1996 | Gloden et al. | 324/207.13 |

OTHER PUBLICATIONS

Defination of Piezo Film Polarity, Amp. Inc. Appln Note 65773, Published Feb. 1, 1994, Revision B.

Retention of PVDF Piezo Activity, Amp. Inc. Appln Note 65802, Published Feb. 1, 1994, Revision B.

Piezo Film Sensors Technical Manual (pp. 7, 21–31), Amp. Inc. Appln. Note 65751, Published Dec. 93.

Wire Lead Attach–DT Senor LDTI–028K, Amp. Inc., Instruction Sheet 408–9939, Pub. Mar. 1, 1994, Revision C.

Application Notes, Piezoceramics, Piezo Kinetics Inc.

*Primary Examiner*—Jay M. Patidar
*Attorney, Agent, or Firm*—Young & Basile, P.C.

[57] ABSTRACT

A magnetostrictive waveguide position measuring apparatus includes a waveguide extending between opposed anchored ends. A magnet is displaceable along the waveguide and generates torsional strain in the waveguide in response to an electrical excitation signal transmitted along the waveguide. A piezoceramic element sensor is coupled to the waveguide to sense the torsional strain signal on the waveguide. A signal processor determines the relative elapsed time between the excitation signal and the output signal of the piezoceramic element to determine the position of the magnet along the waveguide. The sensor is coupled to the waveguide by a low resonance coupling medium. A differential piezoceramic element is formed of two piezoceramic elements, each coupled to the waveguide by individual coupling media, with the two elements connected in a differential parallel configuration and mechanically stressed out of phase to double the output current of the piezoceramic element or connected in a differential series configuration and mechanically stressed out of places to double the output voltage of the piezoceramic element.

17 Claims, 4 Drawing Sheets

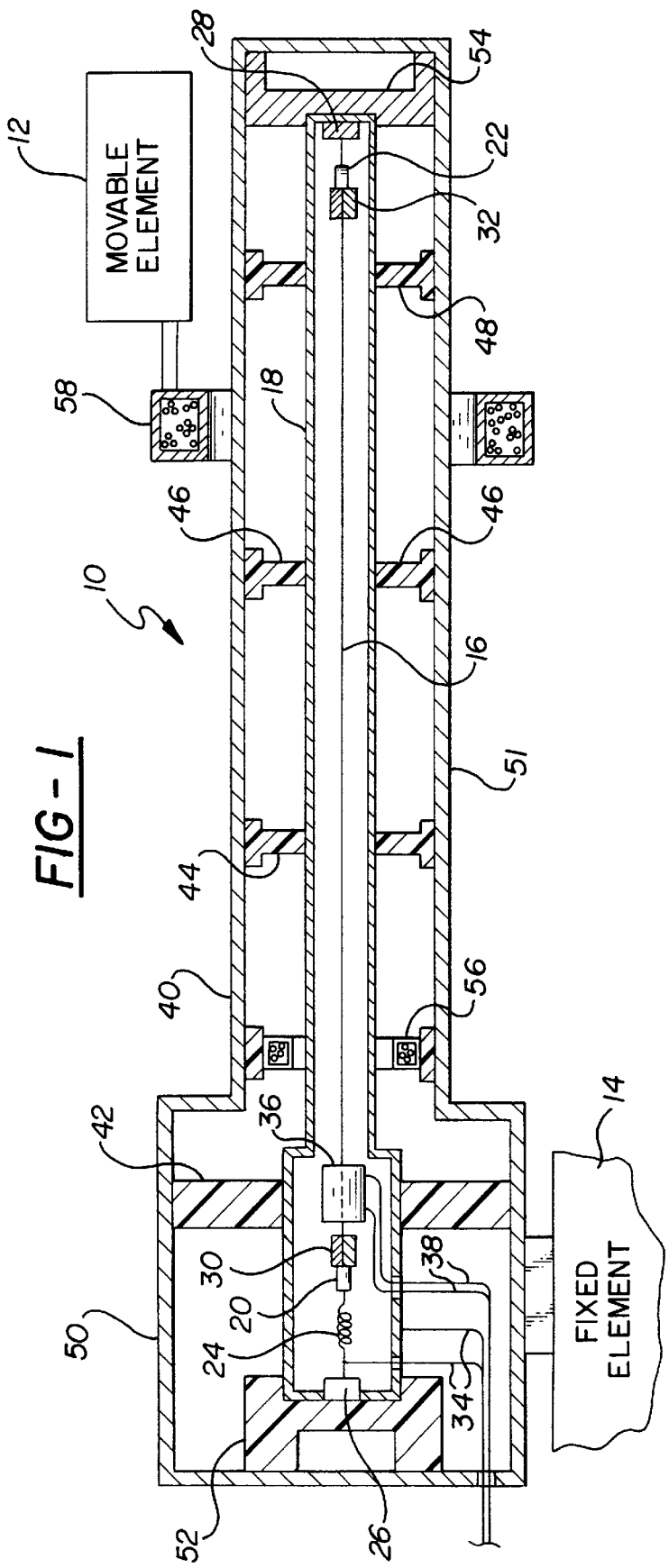

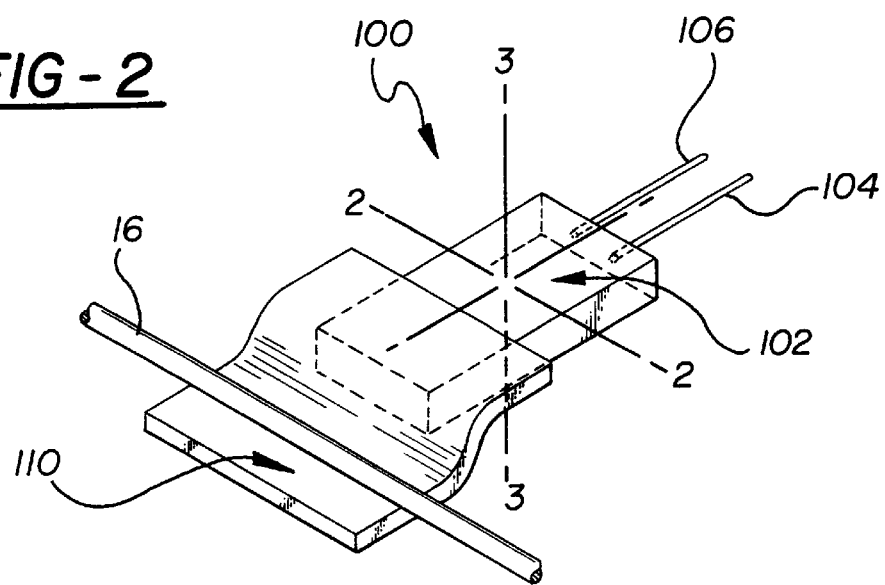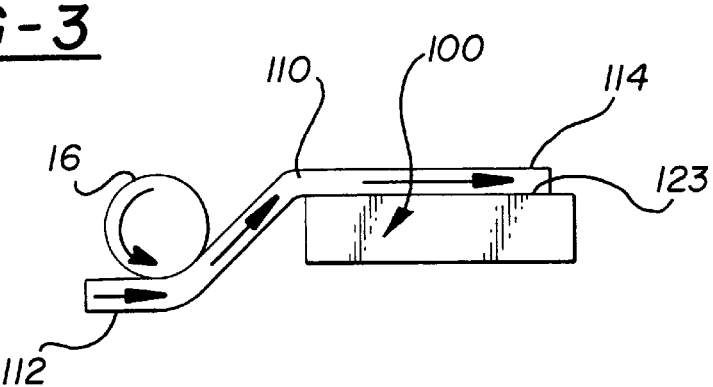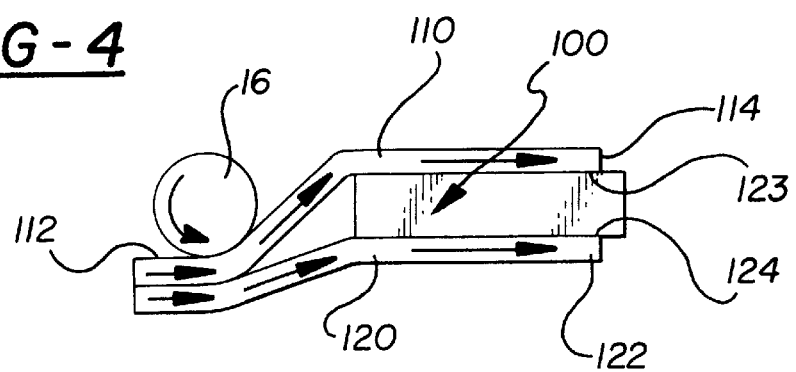

MAGNETOSTRICTIVE WAVEGUIDE POSITION MEASUREMENT APPARATUS WITH PIEZOCERAMIC ELEMENT

BACKGROUND OF THE INVENTION

1. Field of the Invention

This invention relates to position measurement apparatus of the type utilizing a magnetostrictive wire waveguide which extends through a measurement field and in which the position of a movable element within the field is determined as a function of the propagation times of sonic disturbances along the waveguide.

2. Description of the Art

The use of a magnetostrictive wire waveguide to measure the position of a moveable element such as a machine tool component or a float is described in the prior art including, by way of example, U.S. Pat. 4,839,590. In general, the magnetostrictive wire waveguide extends through the measurement field and cooperates with a toroidal "user" magnet which is moveable along and in surrounding relationship to the waveguide, the position of the user magnet being related to the position of a quantity or component being monitored. Although the specific manner of using a magnetostrictive waveguide as a position transducer may vary, the measurement function in all cases involves a determination of the time required for a sonic disturbance to propagate along the waveguide from a fixed position at or near one end of the waveguide to the user magnet or vice versa. Since the propagation speed is known, distance can be determined as a function of time.

The pickup element or sensor mounted at one end of the magnetostrictive has been provided in many different forms. Electromagnetic sensors, such as coils, as well as piezoelectric sensors have been used to detect the sonic strain pulse traveling along the magnetostrictive waveguide. As shown in U.S. Pat. Nos. 4,839,590; 4,943,773 and 5,473,245, a piezoelectric crystal is securely mounted in contact with the magnetostrictive waveguide wire by means of damping pads and various mechanical fastener means. U.S. Pat. No. 5,473,245 discloses that it is known to mount two piezoelectric material plates on opposite sides of the magnetostrictive wire. The opposite faces of these plates are then bonded to a housing or other stable mounting structure to enable the piezoelectric plates to detect the torsional movement of the wire. This patent also discloses the use of a circumferentially closed cylindrical piezoelectric element formed of a plurality of separate radial piezoelectric segments which are interconnected to establish a circumferential polarization.

Despite the prior usage of piezoelectric sensors as pickup elements in magnetostrictive transducers or position measuring devices, there is still a need for a piezoelectric sensor usable in a magnetostrictive waveguide position measuring device which has a strong output signal; which can be provided in different configurations for use in many different applications, and which reduces signal ringing on the waveguide.

SUMMARY OF THE INVENTION

The present invention is a magnetostrictive waveguide position measuring apparatus which uses a magnet displaceable along a measuring area of a magnetostrictive waveguide anchored at opposite ends. An excitation signal is transmitted along the waveguide. The magnet induces a torsional strain along the waveguide in response to the excitation signal, with the torsional strain being transmitted back along the waveguide to a sensor coupled to one end of the waveguide.

In one embodiment, the position measurement apparatus includes a magnetostrictive waveguide extending through a measurement field and anchored at opposite ends, means for electrically exciting the waveguide to send an electrical excitation signal along the waveguide, a magnet displaceable along the waveguide and inducing a torsional strain in the waveguide in response to the excitation signal, and signal means for producing a signal representative of the position of the magnet along the waveguide. The sensor is a piezoceramic element.

The center of the piezoceramic element is preferably disposed at a position one quarter of the signal wavelength from the end anchor to further reduce any transient signal tail.

In a preferred embodiment, the position measurement apparatus includes a low resonance means for coupling the piezoceramic element to the waveguide. Preferably, the low resonance means comprises a low Q coupling member having opposed first and second ends. The first end contacts the waveguide; while the second end contacts the piezoceramic element.

Alternately, two identical coupling members have first overlapped ends disposed in contact with the waveguide. The second ends of the two coupling members contact opposed surfaces of the piezoceramic element.

In another embodiment, a differential sensor is formed of two identical piezoceramic elements, each coupled to the waveguide by an individual low Q coupling member. The two piezoceramic elements are mechanically isolated from each other by an isolating member disposed between the piezoceramic elements and/or the respective coupling members.

The differential piezoceramic element may provide maximized signal amplitude and maximized rejection of common mode mechanical and electrical noise by wiring the two piezoceramic elements electrically out of phase and mechanically coupling both elements to the waveguide such that each element is stressed in opposite modes. Suitable output wiring connections to the piezoceramic elements can double the output current or double the output voltage if desired.

The magnetostrictive waveguide position measuring apparatus of the present invention utilizes a unique piezoceramic element which is coupled to the waveguide by a low Q coupling medium for maximum signal amplitude thereby increasing the detection accuracy of the position measuring apparatus. In addition, the piezoceramic element provides a reduction in signal ringing.

BRIEF DESCRIPTION OF THE DRAWINGS

The various features, advantages, and other uses of the present invention will become more apparent by referring to the following detailed description and drawing in which:

FIG. 1 is a cross-sectional view of a magnetostrictive waveguide position measurement apparatus incorporating a piezoceramic element pickup according to the present invention;

FIG. 2 is a perspective view of one embodiment of the piezoceramic element of the present invention;

FIG. 3 is a side elevational view of the piezoceramic element shown in FIG. 2 incorporating one embodiment of a coupling medium;

FIG. 4 is a side elevational view of the piezoceramic element shown in FIGS. 2 and 3 incorporating a second embodiment of a coupling medium;

DESCRIPTION OF THE PREFERRED EMBODIMENT

Figure 5:
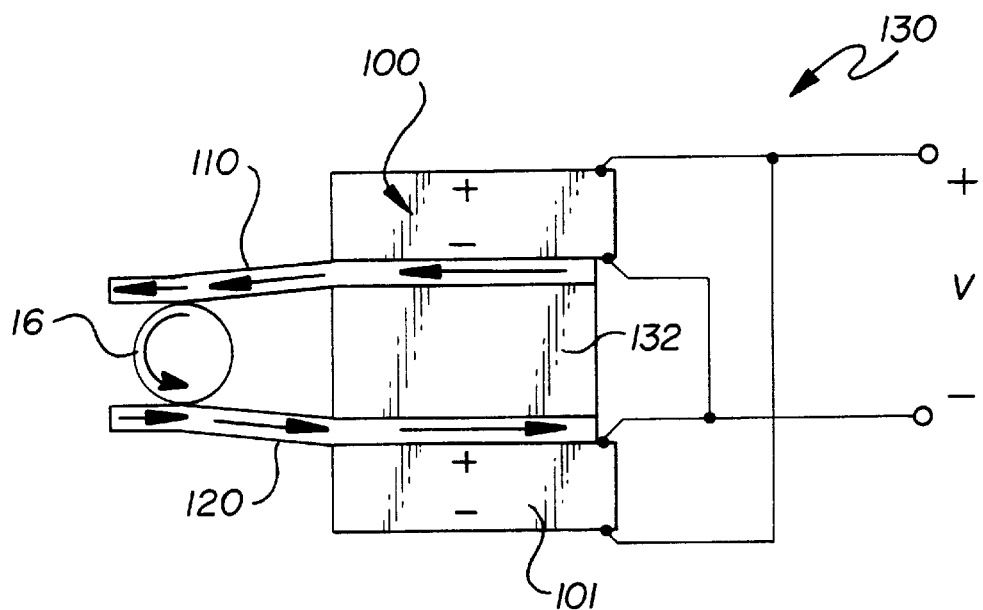
FIG. 5 is a side elevational view of a differential piezoceramic element with a coupling medium and an isolating medium.

Referring to FIG. 1, there is shown a magnetostrictive wire waveguide type position measurement apparatus 10 for determining the position of a moveable element 12 relative to a fixed or reference element 14. It will be appreciated that the moveable and fixed elements 12 and 14 are representative of wide variety of elements, components or quantities associated with various specific applications; by way of example, the moveable element 12 may be a metal cutter mounted and powered to move linearly relative to the frame of a machining center, such frame being represented by fixed element 14. The movable element may also represent a blade or shovel of an earth moving machine which is controllable as to position relative to the frame of the vehicle, said frame being represented by the fixed element 14. Still other possibilities will be apparent to persons skilled in the various arts.

Measurement apparatus 10 comprises a magnetostrictive wire waveguide 16 in the form of a substantially uniform, 0.025" diameter nickel iron alloy wire extending linearly and under tension through a measurement field ranging from a few inches to hundreds of feet. Wire waveguide 16 is mounted concentrically within a 0.125" outer diameter brass tube 18 by way of shackles 20 and 22. Shackle 20 is used as a coupling between the wire waveguide 16 and a compression spring 24 which in turn is secured to an anchor 26, the spring serving to apply appropriate tension to the waveguide essentially to maintain its physical straightness through the interior of the brass tube 18; i.e., the tension applied to the tube is essentially unrelated to the propagation speed of sonic impulses therethrough as hereinafter discussed. Shackle 22 also serves as a coupling between the wire waveguide 16 and a connecting element which is secured to the brass tube by anchor 28. The wire waveguide 16, the shackles 20 and 22, the spring 24 and the brass tube 18 are all conductive so that an electrical circuit is established between terminals on the ends of signal input wires 34 which are connected to electronics described hereafter. Reflection damping pads 30 and 32 of silicon rubber or other appropriate resilient material are clamped about the terminal ends of the wire waveguide 16 for reflection damping purposes as is better described below with reference to FIG. 2. A pick-up element 36 surrounds the uniform portion of wire waveguide 16 near the left terminal end as shown in FIG. 1 and is connected by conductive wires 38 to the electronics.

The arrangement and dimensions given above are examples only. The waveguide, for example, need not be linear but may be curved to accommodate a given measurement field.

The brass tube 18 containing the waveguide 16 is resiliently mounted within a steel outer housing 40 having a head 50 and a body 51 of generally tubular configuration by means of washer or disk shaped suspension components 42, 44, 46, and 48 of silicon rubber or other resilient material. Rubber acoustic dampening end structures 52 and 54 are provided between the ends of the brass tube 18 and the ends walls of the steel housing 40 to provide resilient suspension in the axial or longitudinal direction. The material and physical properties; i.e., the shape, density and resilience of the acoustic dampening suspension system components 42, 44, 46, 48, 52, and 54 can be chosen to filter out or dampen shock inputs in almost any selected frequency range which is expected in the environment of use. As a general proposition, the material of the suspension system components is chosen to filter out relatively high frequency shock inputs; e.g., those having a characteristic frequency above 200 hertz.

The configurations of the suspension system components in FIG. 1 are intended as examples for illustration only and it will be appreciated by those skilled in the applicable arts that other configurations can be chosen in accordance with the configuration of the anchoring and housing structures associated with a particular waveguide apparatus. In general, it is the objective of the suspension system to isolate the wire waveguide 16 from externally created or applied shock inputs along all three axes; i.e., the longitudinal axis and the radial axis. The effect of "floating" the wire waveguide 16 and its support tube 18 within the fixed external housing 40, however, requires special considerations insofar as position measurement accuracy is concerned as hereinafter described.

As mentioned above, the waveguide 16 serves as a transducer which extends under tension through the measurement field. For this purpose, a first magnet 56 is mounted within and to the internal cylindrical surface of the steel housing 10 at a point spaced longitudinally from but near the left end of the wire waveguide 16 as shown in FIG. 1; i.e., near the end at which the pick-up element 36 is located. Magnet 56 is preferably an electromagnet which is excited only when a measurement is underway. However, it may also be a permanent magnet and need not be within the housing 40. In all cases, however, magnet 56 is a position "reference" magnet and is rigidly fixed relative to the measurement field.

A second permanent magnet 58, herein referred to as a "user magnet", is disposed around the cylindrical body 51 of the steel housing 40 in spaced relationship thereto and is moveable longitudinally or axially along the tube 40 and the wire waveguide 16 by virtue of being mechanically attached to the moveable element 12 the position of which is to be monitored. This mechanical connection can take a variety of forms as described briefly above. The advantages of the shock filtering suspension system are, of course, greatest in environments which involve a likelihood of shock or vibration.

In general, the operation of the device shown in FIG. 1 entails the application of a current pulse to the wire waveguide 16 by way of input wires 34. This current pulse reacts to the magnetic fields created by the reference and user magnets 56 and 58, respectively, to create essentially simultaneous sonic disturbances or impulses in the wire waveguide which propagate linearly in both directions. The pick-up element 36 receives the sonic disturbance from the reference magnet 56 first in time. The pick-up element 36 receives the sonic disturbance associated with user magnet 58 second in time, the interval between the arrival of the impulse from reference magnet 56 and the arrival of the pulse from user magnet 58 being a function of the axial position of magnet 58 along the outside surface of the tube 40. Because sonic propagation speed in waveguide 16 is known, the time between the arrivals of the pulses is an indication of the position of the moveable element 12 relative to the magnet 56 and the fixed element 14 on which the housing 40 is carried. Using apparatus and methods hereinafter described, the exact length of the time interval is determined and the position of the moveable element 12 is either recorded or displayed, the term "display" being used herein to represent any effective utilization of the position signal output.

The physical configuration of the wire waveguide 16 and particularly the left and right terminal ends thereof are shown in detail. The wire waveguide which, as mentioned above, can be effectively any desired length, is nominally of circular or round cross-section throughout the measurement field. However, to reduce the amplitude of the reflections of sonic disturbances propagating along the waveguide from the terminal ends thereof, the left and right terminal portions which lie outside of the measurement field; e.g., end portions of approximately 1"–3" in length, may be mechanically physically altered in section into a gradually flattened and widened shape. These terminal end portions are attached, such as by soldering, to the end surfaces of the conductive shackles 20 and 22. Obviously, other attachment mechanicals can be employed. It has been found that a gradual rather than an abrupt change in waveguide wire configuration reduces the tendency of the waveguide material to reflect sonic disturbances propagating along the wire. The term "gradual" means that the cross-sectional shape change occurs over a length which is larger than and, typically, a multiple of the nominal wire diameter. Moreover, the change from a circular or round configuration to a flat, widened, essentially rectangular configuration over a distance which is large relative to the diameter of the wire changes significantly the surface area to volume ratio of the wire material and provides a large surface area for physical contact with pads 30 and 32 at the left and right terminal ends of the wire 16, respectively. The pads 30 and 32 are suitably clamped into a contacting configuration which sandwiches the flattened portions of the wire waveguide 16 therebetween. The result is a substantial reduction in sonic reflection at the terminal ends and a simplification of the signal processing circuitry as hereinafter described. The shape transition of the terminal ends of the waveguide 16 has been found to provide reflection dampening ratios of up to 100:1 as compared with prior art anti-reflection techniques which provide ratios of only about 20:1. Moreover, the flattened sections have been found to be far less sensitive to clamping pressure and, therefore, give rise to relaxed construction requirements and greater uniformity in product performance. The pick-up element 36 is spaced far enough from left end of waveguide 16 to be around the uniform 0.025" diameter portion thereof.

As shown in FIGS. 2–6, in a preferred embodiment, the pick-up element 36 is formed as a piezoceramic element 100. The piezoceramic element 100 is a small ceramic chip of a suitable dielectric material, preferably lead zirconate titante, that has been heated in the presence of a strong polarizing d.c. voltage to align the molecular dipoles in the direction of the applied magnetic field.

Piezoceramic element 100 is formed with an active area 102 of generally polygonal configuration, such as rectangular, square, etc.; although other shapes, i.e., circular, are also possible. As is conventional, the active area 102 has a positive surface on one side and a negative surface on the opposite side. A pair of elongated conductors 104 and 106 are joined to and extend from the active area 102, with conductor 104 connected to and extending from the positive surface of the active area 102 and conductor 106 connected to and extending from the negative surface of the active area 102.

In accordance with standard crystallographic notation, the active area 102 has three mutually exclusive axes extending therethrough. Length axis 1 and width axis 2 extend transverse or generally perpendicular to a thickness axis 3. Axis 3 is the polarized axis of the piezoceramic element 100.

The resonant effects of the piezoceramic element 100 vary greatly with the size of the element. In general, the smaller the size the smaller the signal that is produced. Conversely, the larger the size, the more ringing is seen in the tail of the signal. One size that has proven to exhibit good signal levels and a good lack of resonance is a piezoceramic element 100 that is 0.130 in. wide×0.190 in. long×0.020 in. thick. The 0.130 in. dimension extends along the width axis 2. A piezoceramic element 100 that is thinner than 0.020 in. can exhibit better signal performance. However, it is difficult to work with since the brittle, thin ceramic is easily cracked.

The piezoceramic element 100 is a hard, resonant material with a high mechanical Q. Placing the magnetostrictive wire 16 in direct contact with the piezoceramic element 100 can produce a strong signal, but the signal will resonate producing a long ring or tail when amplified. This is because the point or line of contact between the magnetostrictive wire 16 and the piezoceramic element 100 extends over a small area causing a high strain to be induced in relatively few ceramic molecules. The torsional pulse causes a high strain in these molecules producing a resonant condition in the high Q piezoceramic element 100.

Further, the long signal tail can cause position errors in certain applications where sensing multiple signals that are close together is needed. The tail of one signal can distort a subsequent signal if the tail is long enough and the subsequent signal is close enough.

The present invention is intended to overcome this problem by utilizing a low Q coupling medium 110 to reduce the signal tail. In a preferred embodiment, the coupling medium 110 is formed of a low Q or resonant material, such as a suitable plastic film. Mylar film is usable as an exemplary coupling medium having a low Q. Such a coupling medium is also softer than the hard piezoceramic element 100 and is flexible so as to enable it to be formed into a suitable shape to couple the magnetostrictive wire 16 to the piezoceramic element 100.

FIG. 3 depicts one coupling arrangement wherein the thin flexible coupling medium 110 is disposed at a first end 112 in contact with the magnetostrictive wire waveguide 16 and at an opposite end 114 with one surface 123 of the piezoceramic element 100. By example only, the magnetostrictive wire waveguide 16 is shown generally in line with or substantially in parallel to the width axis 2 of the piezoceramic element 100 such that the coupling medium 110 curves or bends between the contacting surfaces of the waveguide 16 and the piezoceramic element 100. It will be understood that the waveguide 16 and the piezoceramic element 100 can be offset such that the coupling medium 110 extends in a generally planar fashion between the waveguide 16 and the piezoceramic element 100. Further, the waveguide 16 contacts the coupling medium 110 such that the waveguide 16 is parallel to the width axis 2 on the 0.130" dimension of the piezoceramic element 100.

In this coupling arrangement, the torsional pulse from the waveguide 16 is transferred to the coupling medium 110 and then washes over the piezoceramic element 100 as a wave straining more molecules than if the waveguide 16 contacted the piezoceramic element 100 directly. The resonant condition is thereby reduced, producing a shorter signal tail.

It is preferred that the waveguide wire 16 be placed on the coupling medium 110 in close proximity to the piezoceramic element 100. This results in a signal having a greater magnitude than if the waveguide 16 is located further away from the piezoceramic element 100.

FIG. 4 depicts an alternate embodiment of a coupling arrangement in which two substantially identical coupling mediums 110 are overlapped, with one of the coupling mediums 110 disposed in direct contact with the coupling medium 16 and one end of the other waveguide wire 120 contacting the end 112 of the first coupling medium 110 disposed in contact with the waveguide wire 16. In this manner, the torsional pulse from the waveguide 16 is transmitted simultaneously through both coupling mediums 110 and 120 although to a slightly lesser extent in the second coupling medium 120.

The opposite ends 114 and 122 of the coupling mediums 110 and 120, respectively, are disposed in contact with opposite faces 123 and 124 of the piezoceramic element 100. Due to the use of two coupling mediums 110 and 120, more molecules are strained in the piezoceramic element 100 thereby resulting in a higher magnitude output signal.

The torsional strain pulse on the magnetostrictive waveguide wire 16 produces a sine wave of about 3 periods at a frequency of 100 Khz that expands and decays within an envelope. The first major positive lobe is the desired point for triggering a comparator to detect the arrival of the torsional strain pulse.

In operation, the strain pulse in the waveguide wire 16 is reflected off of an end anchor which is preferably placed near the piezoceramic element 100. The reflected pulse is of opposite polarity from the original strain pulse. In a preferred embodiment, the center of the active area 102 of the piezoceramic element 100 (i.e., the intersection of the 1 and 2 axes) is placed at a distance of approximately ¼ of the signal wavelength, or about ¼ inch at a 100 Khz signal frequency, from the end anchor to produce some cancellation effects on the signal tail.

Further, the waveguide wire 16 is preferably grounded at the end anchor adjacent to the piezoceramic film element 100. This reduces the electric fields at the piezoceramic element 100 and reduces a transient induced in the signal amplifier from the transmitted current pulse.

Referring now to FIG. 5, there is depicted a differential piezoceramic sensor 130. The differential piezoceramic element 130 is formed of a pair of identical piezoceramic elements 100 and 101.

In using the differential piezoceramic element 130, two coupling mediums 110 and 120 are disposed in contact with opposite surfaces of the waveguide wire 16. A torsional strain in the waveguide wire in the direction of the arrow shown in FIG. 5, will induce opposite mechanical stresses in the two coupling mediums 110 and 120 such that coupling medium 110 is stressed in tension; while the opposite coupling medium 120 is stressed in compression.

As also shown in FIG. 5, the two piezoceramic elements 100 and 101 are disposed electrically out of phase with the negative surface of the piezoceramic element 100 disposed in contact with the first coupling medium 110 and the positive surface of the other piezoceramic element 101 disposed in contact with the second coupling medium 120. When the electrodes of the piezoceramic elements 100 and 101 are connected as shown in FIG. 5, the output current will be doubled and remain in phase. It should be noted that the two piezoceramic elements 100 and 101 must be mechanically isolated from each other. Preferably, an isolating member or medium, such as an isolating rubber pad 132, is interposed between the coupling mediums 110 and 120 and piezoceramic elements 100 and 101.

The differential mode connection shown in FIG. 5 connects the two piezoceramic elements 100 and 101 out of phase. Stresses or induced noise that are present in both elements 100 and 101 cancel; while stresses that are of opposite mode will add. As the longitudinal strain is along the 2 axis of both elements 100 and 101, the longitudinal strain is a common mode for both elements 100 and 101. This yields further longitudinal attenuation due to the differential common mode cancellation. Other unwanted signals, such as noise caused by shock, vibration or EMI, are also attenuated by the differential cancellation.

Figure 6:
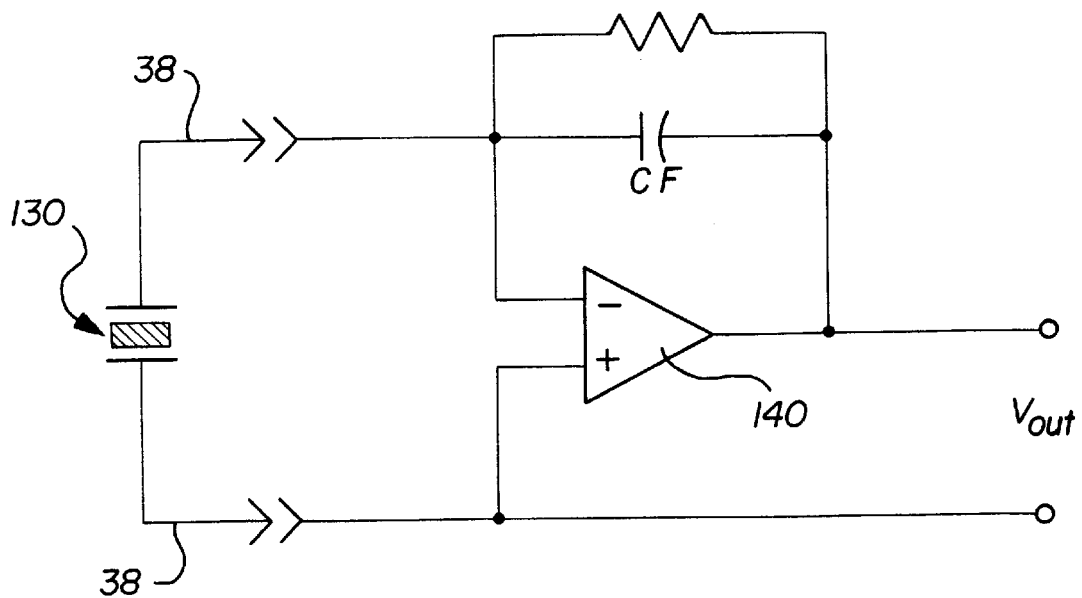
FIG. 6 is a schematic diagram of a charge mode amplifier connected to the output of the piezoceramic element shown in FIG. 5.

A charge mode amplifier 140 connected as shown in FIG. 6 to the output of the piezoceramic element 130 by conductive wires 38 can take advantage of the current doubling produced by the piezoceramic element 130 wiring configuration shown in FIG. 5 and described above. In FIG. 6, the voltage output of the charge amplifier 140 is determined by Q/Cf where Q is the charge developed on the piezoceramic element 130 and Cf is the feedback capacitance of the charge amplifier 140. Thus, the output voltage of the charge amplifier depends on the feedback capacitance, and not the input capacitance. This indicates that the output voltage of the charge amplifier 140 is independent of cable capacitance which enables a long cable to be used between the piezoceramic element 130 and the signal electronics as is necessary in the headless magnetostrictive waveguide shown in FIG. 1 wherein the signal processing electronics are separated or remote from the piezoceramic element 130 by a considerable distance.

Figure 7:
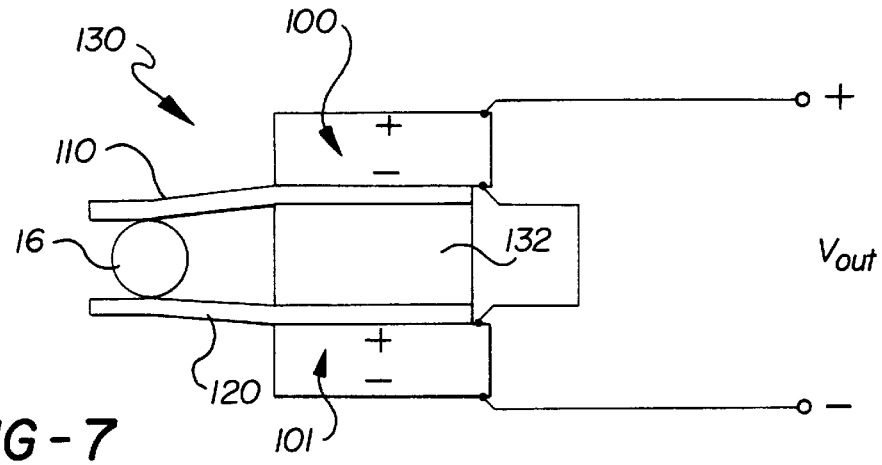
FIG. 7 is a side elevational view of a differential, series connected piezoceramic element according to an embodiment of the present invention.

As shown in FIG. 7, the piezoceramic elements 100 and 101 may also be electrically connected in series while still being arranged to be mechanically stressed in opposite modes. This has the effect of doubling the output voltage from the complete piezoceramic element 130.

Figure 8:
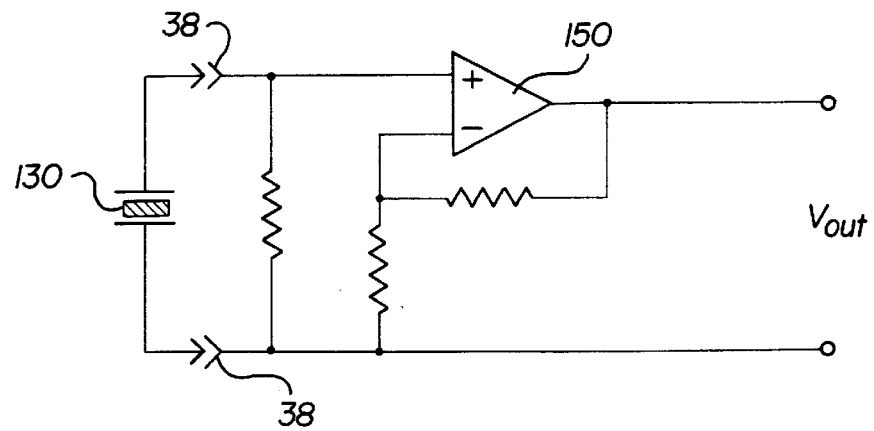
FIG. 8 is a schematic diagram of a voltage mode amplifier connected to the output of the piezoceramic element shown in FIG. 7.

FIG. 8 illustrates a voltage mode amplifier 150 which is connected by conductive wires 38 to the piezoelectric element 130 to take advantage of the voltage doubling by the configuration shown in FIG. 7. The voltage mode amplifier 150 has a significant advantage with respect to temperature since the torsion signals produced from the sonic pulse on the wire 16 will not attenuate as much with temperature drops. This results from lower temperatures causing lower dielectric Constance in the piezoceramic elements 100 and 101 and therefore lower capacitance. A negative effect of use of the voltage mode amplifier 150 is less immunity to EMI because of the higher impedance circuit. Waveguide ringing is another disadvantage and results from less current and therefore less power generated by the piezoceramic elements 100 and 101.

Figure 9:
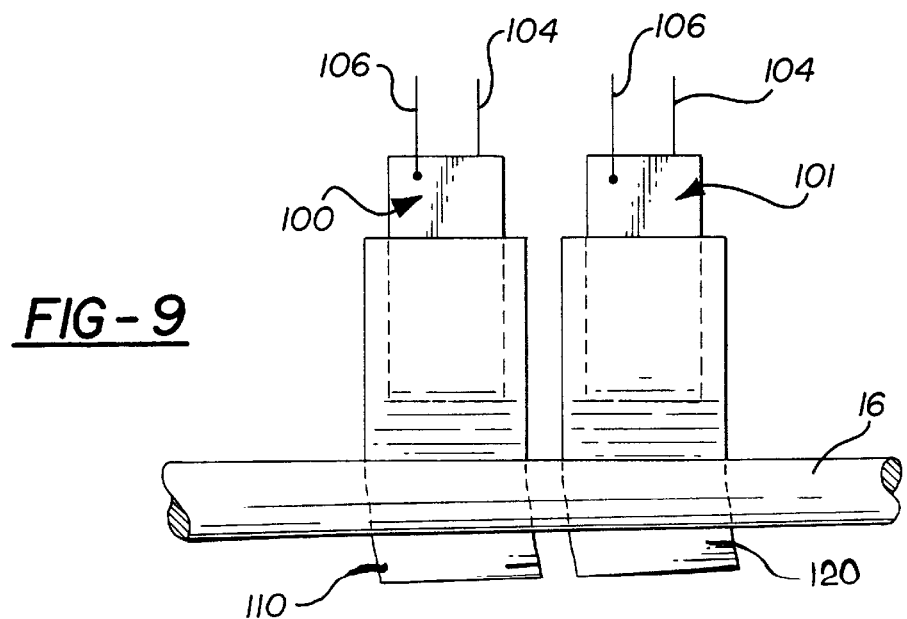
FIG. 9 is a plan view of a horizontal stacked arrangement of piezoceramic elements of the present invention.

FIG. 9 depicts a horizontally stacked arrangement of piezoceramic elements 100 and 101. It will be understood that any number of piezoceramic elements 100, 101, etc., may be employed subject to the requirement that the total length of the piezoceramic elements 100, 101, etc., along the length of the magnetostrictive wire 16 is equal to or less than a length that is one-half the wavelength of the sonic pulse on the wire 16 (typically 100 KHz).

As shown in FIG. 9, the coupling medium 110 is coupled between the wire 16 and the piezoceramic element 100. Similarly, the coupling medium 120 mechanically couples the wire 16 to the piezoceramic element 101.

A conventional signal processing apparatus, not shown, but remote from the device produces position signal outputs. The signal processing circuitry includes appropriate signal conditioning circuitry apparent to those skilled in the electronics arts to receive the input signal on wires 34 which is used to excite the wire waveguide 16 as previously described. The circuitry is connected to receive as inputs the pulses which are generated in pick-up element 36, as coupled through the amplifier 140, as the sonic disturbances from the magnets 56 and 58 propagate along the wire waveguide 16 from right to left as shown in FIG. 1. The signal processing described herein can be accomplished with electronics or a digital computer; for example, hardwired, analog devices can be used. The terms "computer" and "microprocessor", as used herein, are not to be construed only to describe digital or even programmable devices.

Further details concerning the construction of a suitable signal processing apparatus can be obtained by referring to U.S. Pat. application Ser. No. 08/615,489, now U.S. Pat. No. 5,714,881 issued Feb. 3, 1998 the contents of which are incorporated by reference.

What is claimed is:

1. A position measurement apparatus including a magnetostrictive waveguide extending through a measurement field, and signal means for producing a signal representative of the position of a magnet along the waveguide, the position measurement apparatus comprising:

a piezoceramic element; and low resonance means for coupling the piezoceramic element to a waveguide;

the piezoceramic element connected to the signal means.

2. The position measurement apparatus of claim 1 wherein the low resonance means comprises:

a low Q coupling member having opposed first and second ends, the first end contacting the waveguide, the second end contacting the piezoceramic element.

3. The position measurement apparatus of claim 2 wherein:

the piezoceramic element has a length greater than a width;

the low Q coupling member contacting the waveguide such that the waveguide is substantially parallel to the width of the piezoceramic element.

4. The position measurement apparatus of claim 2 further comprising:

a plurality of piezoceramic elements;

each of the plurality of piezoceramic elements coupled to the waveguide by a separate low Q coupling member; and the plurality of piezoceramic elements disposed side-by-side along a length of the waveguide and having a total length that is less than or equal to one-half of the wavelength of the excitation signal transmitted on the waveguide.

5. The position measurement apparatus of claim 1 wherein:

a center of the piezoceramic element is spaced a distance substantially equal to one quarter of the wavelength of the excitation signal from an end anchor on the waveguide.

6. The position measurement apparatus of claim 1 wherein the low resonance means comprises:

first and second low Q coupling members, each having opposed first and second ends;

the first ends of the first and second coupling members disposed in overlapping contact with the waveguide; and the second ends of the first and second coupling members contacting opposite surfaces of the piezoceramic element.

7. The position measurement apparatus of claim 1 wherein the piezoceramic element comprises:

first and second piezoceramic elements; and the low resonance means including first and second low resonance members respectively contacting the first and second piezoceramic elements at one end and opposite surfaces of the waveguide at another end.

8. The position measurement apparatus of claim 6 wherein:

the first and second piezoceramic elements are coupled to the first and second coupling members mechanically out of phase so as to be stressed in opposite modes.

9. The position measurement apparatus of claim 8 wherein:

the first and second piezoceramic elements are electrically connected in parallel to substantially double the output current therefrom.

10. The position measurement apparatus of claim 9 further comprising:

an amplifier connected in charge mode; and an output of the piezoceramic element connected to an input of the amplifier.

11. The position measurement apparatus of claim 8 wherein:

the first and second piezoceramic elements are connected in series to substantially double the output voltage thereof.

12. The position measurement apparatus of claim 11 further comprising:

an amplifier connected in voltage mode;

an output of the piezoceramic element connected to an input of the amplifier.

13. The position measurement apparatus of claim 7 further comprising:

means for mechanically isolating the first piezoceramic element and the first low resonance member from the second piezoceramic element and the second low resonance member.

14. The position measurement apparatus of claim 13 wherein the isolating means comprises:

a damping member disposed between the first and second piezoceramic elements.

15. The position measurement apparatus of claim 7 wherein:

the first and second piezoceramic elements are electrically connected in parallel to substantially double the output current therefrom.

16. The position measurement apparatus of claim 1 wherein:

the piezoceramic element has a length greater than a width;

the low resonance means contacting the waveguide such that the waveguide is substantially parallel to the width of the piezoceramic element.

17. The position measurement apparatus of claim 1 further comprising:

the plurality of piezoceramic elements;

each of the polarity of piezoceramic elements coupled to the waveguide by a separate low resonance member;

the plurality of piezoceramic elements disposed side-by-side along the length of the waveguide and having a total length that is less than or equal to one-half of the wavelength of the excitation signal transmitted on the waveguide.

* * * * *

UNITED STATES PATENT AND TRADEMARK OFFICE
CERTIFICATE OF CORRECTION

PATENT NO.  : 5,821,743
DATED       : October 13, 1998
INVENTOR(S) : William J. Page and Richard D. Koski It is certified that error appears in the above-identified patent and that said Letters Patent is hereby corrected as shown below:

Column 9, line 19, after "field" insert --and anchored at opposite ends, means for electrically exciting the waveguide to transmit an electrical excitation signal along the waveguide, a magnet displaceable along the waveguide and inducing a torsional strain in the waveguide in response to the excitation signal--.

Column 9, line 20, after "position of" delete "a" and insert --the--.

Column 10, line 58, delete "a" and insert --the--.

Column 10, line 59, delete "polarity" and insert --plurality--.

Column 10, line 60, delete "member" and insert --means--.

Signed and Sealed this

Fourth Day of May, 1999

Attest:

Q. TODD DICKINSON

*Attesting Officer*            Acting Commissioner of Patents and Trademarks